(12) United States Patent
Gehrmann

(10) Patent No.: US 6,271,550 B1
(45) Date of Patent: Aug. 7, 2001

(54) JUNCTION FIELD EFFECT TRANSISTOR OR JFET WITH A WELL WHICH HAS GRADED DOPING DIRECTLY BENEATH THE GATE ELECTRODE

(75) Inventor: Andreas Gehrmann, Dortmund (DE)

(73) Assignee: Elmos Semiconductor AG, Dortmund (DE)

(*) Notice: Subject to any disclaimer, the term of this patent is extended or adjusted under 35 U.S.C. 154(b) by 0 days.

(21) Appl. No.: 09/374,987

(22) Filed: Aug. 16, 1999

(30) Foreign Application Priority Data

Aug. 17, 1998 (DE) .............................................. 198 37 175

(51) Int. Cl.⁷ .................................................. H01L 29/80
(52) U.S. Cl. .................... 257/285; 257/286; 257/328; 257/329; 257/330; 257/256; 257/263; 438/186; 438/192
(58) Field of Search .................................. 257/285, 286, 257/328, 329, 338, 256, 263; 438/186, 192

(56) References Cited

U.S. PATENT DOCUMENTS

| | | | |
|---|---|---|---|
| 3,430,114 | * 2/1969 | Morel | 257/287 |
| 4,327,475 | * 5/1982 | Asai et al. | 438/195 |
| 4,463,366 | * 7/1984 | Ishii et al. | 257/260 |
| 4,482,907 | * 11/1984 | Jay | 257/284 |
| 5,359,214 | * 10/1994 | Kurtz et al. | 257/287 |
| 5,378,655 | * 1/1995 | Hutchings et al. | |
| 5,554,862 | * 9/1996 | Omura et al. | |
| 6,020,607 | * 2/2000 | Nagai | 257/266 |

* cited by examiner

Primary Examiner—Nathan Flynn
Assistant Examiner—Kevin Quinto
(74) Attorney, Agent, or Firm—Birch, Stewart, Kolasch & Birch, LLP

(57) ABSTRACT

In a channel well of a semiconductive substrate, source, drain and gate electrodes are formed. Below the gate electrode region, a plurality of partial regions of the second conductive type are arranged next to each other in the direction of the extension of the gate electrode region and in a mutually spaced relationship, said partial regions bordering on the gate electrode region and extending through the channel well region into the region of the substrate bordering on the channel well region from below.

6 Claims, 2 Drawing Sheets

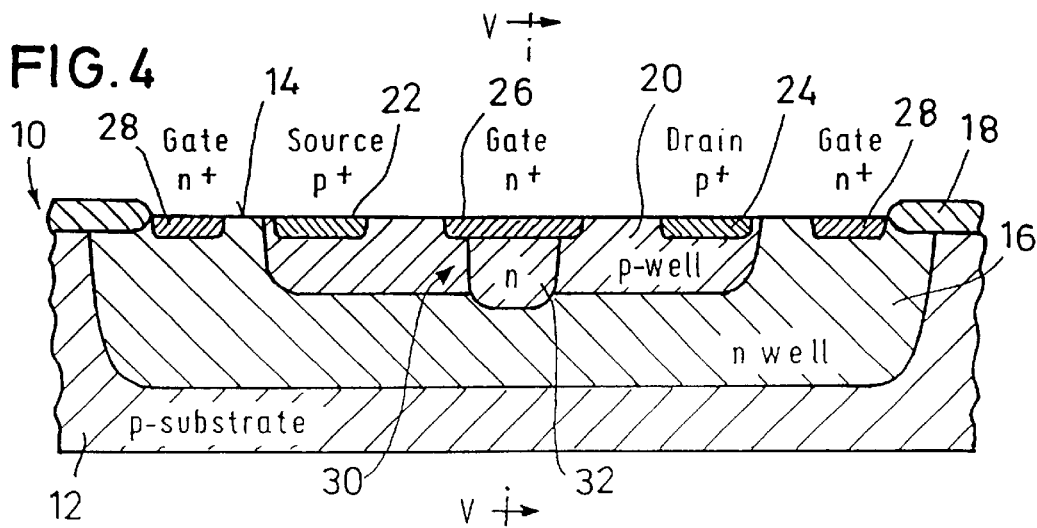
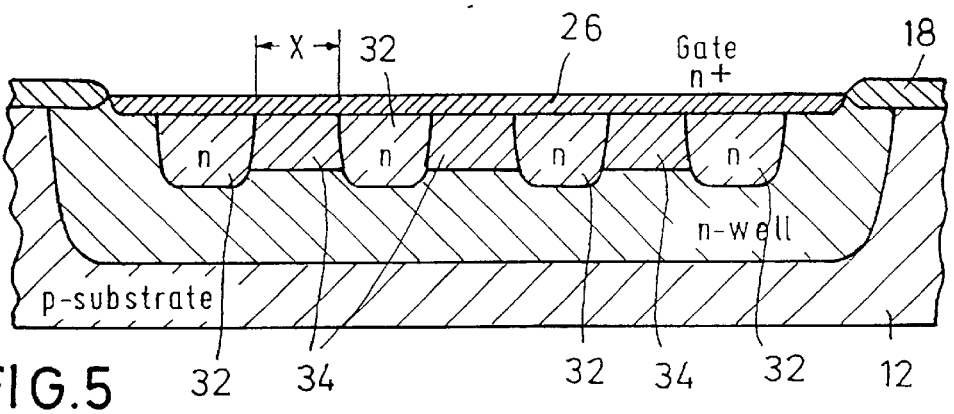
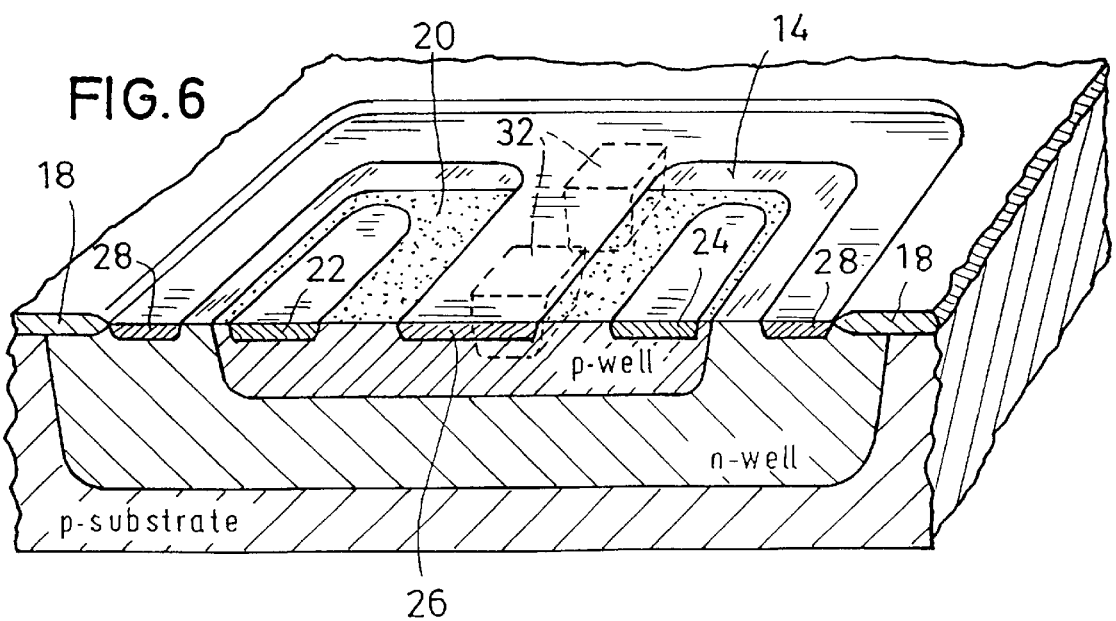

JUNCTION FIELD EFFECT TRANSISTOR OR JFET WITH A WELL WHICH HAS GRADED DOPING DIRECTLY BENEATH THE GATE ELECTRODE

BACKGROUND OF THE INVENTION

The present invention relates to a JFET transistor whose pinch-off voltage can be set by layout measures.

Depending on the specific requirements to be fulfilled by a transistor, a JFET transistor may be preferable to a MOS transistors. Thus, for instance, a JFET transistor has a lower noise than a MOS transistor because the current flow through a JFET transistor is not caused by surface effects but occurs "in the depth" below the surface of the substrate.

The state of the art includes JFET transistors configured according to FIGS. 1–3 and produced in CMOS technology. A p-substrate 1 having a surface 2 is provided, by way of diffusion, with an n-well 3 therein which in turn has a p-well 4 embedded therein. Arranged in this p-well 4 are source and drain electrode regions 5,6 with a degenerate p-doping, having arranged therebetween a gate electrode region 7 with a degenerate n-doping. As evident from the systematic view of FIG. 3, the gate electrode region 7 extends in the manner of a web transversely across the p-well 4 and into the n-well 3 in which the gate electrode region is formed as an annular region 8 surrounding the p-well 4. The adjacent region of the surface 2 of the p-substrate 1 arranged external of this annular region 8 is covered by field oxide 9.

In the example of a known JFET transistor illustrated in FIGS. 1–3, the p-well 4 forms the channel of the JFET transistor (p-channel JFET transistor). The control of the channel and thus the control of the current flow takes place via the space-charge zone between the gate electrode region 7 and the p-well 4 which in comparison with this electrode region has a considerably weaker doping. As a result of the selected doping material concentrations, this space-charge zone is generated for the most part in the p-well 4.

By the above configuration, it is accomplished that
the transistor is insulated from the p-substrate by two p-n-transitions, and the substrate potential will thus have no effects on the transistor parameters and particularly on the pinch-off voltage, and
the JFET transistor has a lower noise because of the channel extending below the silicon surface.

The above advantages require suitable wells 3,4, wherein the n-well 3 must be significantly deeper than the p-well 4 to obtain the necessary insulating characteristics and voltage sustaining capabilities. For setting the desired pinch-off voltage, there are required, on the one hand, an exactly defined depth of the gate electrode region 7 and, on the other hand, an exact depth of the p-well 4 as well as an exactly set doping material concentration in the p-well 4.

An integration of the known construction into an existing CMOS process requires a considerable process expenditure, notably for the following reasons:

In an existing n-well CMOS-process, it becomes necessary to introduce an additional p-well along with a complete change of the beginning of the process (well diffusion/field oxidation/temperature balance).

When using epitaxial substrates, the penetration depth of the n-well is limited by the outdiffusion of the substrate doping.

In a diffused p-well, the surface concentration (voltage sustaining capability of the gate electrode) and the doping profile in the depth (conductivity of the channel) are coupled with each other.

The diffusion depth of the gate electrode is to be exactly adapted to the desired pinch-off voltage and must be controlled.

The pinch-off voltage of the transistor is fixedly determined by the diffusion depths and profiles set in the process.

An adaptation of the well doping/diffusions will at the same time have an influence on nearly all other constructional components.

As evident from the above, it is only by changing the process parameters (diffusion depth of the gate electrode region and depth of p-well 4) that the pinch-off voltage JFET transistor can be influenced. In an existing CMOS process, however, it is highly undesirable to change the process parameters of individual process steps for individual components.

Thus, it is an object of the invention to provide a JFET transistor which can be produced in CMOS technology without the need to change the process parameters for setting the pinch-off voltage.

SUMMARY OF THE INVENTION

For solving the above object, the instant invention provides a JFET transistor comprising
a semiconductive substrate,
a channel well region of a first conductive type formed in the substrate,
a source and a drain electrode region of the first conductive type which are arranged in a mutually spaced relationship in the channel well region,
a gate electrode region of a second conductive type opposite to the first conductive type, extending between the source and drain electrode regions through the channel well region into the region of the substrate surface external of the channel well region, wherein said region and the rest of the surrounding region of the substrate laterally of and below the channel well region is doped with charge carriers of the second conductive type, and wherein, below the gate electrode region, a channel region is formed within the channel well region, with the cross section of said channel region being controllable by means of space-charge zones formed in the transition regions between the gate electrode region and the channel well region.

According to the instant invention, the above JFET transistor is characterized in that
below the gate electrode region, a plurality of partial regions of the second conductive type are arranged next to each other in the direction of the extension of the gate electrode region and in a mutually spaced relationship, said partial regions bordering on the gate electrode region and extending through the channel well region into the region of the substrate bordering on the channel well region from below.

In the JFET transistor according to the instant invention, the channel is controlled not only in a vertical direction, as in the state of the art, but also in a lateral direction. For this purpose, the gate electrode region in the channel well region forming the channels has arranged therebelow a plurality of partial regions arranged transversely to the direction of the current flowing between the drain and the source and in a mutually spaced relationship. These partial regions extend from the gate electrode region in a vertical direction through the channel well region into that region in the substrate which is arranged adjacent this channel well region from below. The doping of these partial regions is opposite to the doping of the channel well region but considerably higher than the doping of the channel well region so that space-charge zones are formed laterally between adjacent partial regions in the channel well region. These space-charge zones whose extension depends on the potential of the gate electrode region, change the width of the effective channel, thus allowing a controlling of the current flow and particularly the pinch-off voltage. The pinch-off voltage will thus depend on the distance of the individual partial regions and can be influenced by design and layout measures when developing the JFET transistor. Therefore, the introduction of the inventive laterally effective pinch-off of a channel of a JFET transistor does not require any alterations of the thermal balance or further process steps of the CMOS process used for the manufacture of the JFET transistor so that the manufacturing process for the inventive JFET transistor is CMOS-compatible and is distinguished by a modular process option, i.e. the lateral pinch-off. Suitably, the channel well region is embedded in a further well region, the embedment well region. These two well regions are doped with charge carriers of different conductive types; thus, for instance, the embedment well region has a doping of the n-type while the channel well region has a doping of the p-type.

Particularly suited for the above well-in-well configuration is the thermally induced n-well diffusion as an embedment well region, as known from n-well CMOS processes, while the channel well region is ion-implanted. In CMOS processes, such implantations are known e.g. as a drain extension (drift distance) of the MOS transistors. If this ion implantation is performed in a plurality of steps, particularly in two steps, it becomes possible to lend a retrograde doping material concentration profile to the channel well region in the vertical direction. Such a retrograde (well) profile is distinguished by a lowest possible surface doping material concentration and a sufficiently high doping material concentration in the depth. While the low surface doping material concentration provides for the desired voltage sustaining capability towards the gate electrode region, a sufficiently high doping material concentration will safeguard the highest possible doping material concentration.

BRIEF DESCRIPTION OF THE DRAWINGS

Preferred embodiments of the invention will be explained in greater detail hereunder with reference to the accompanying drawings.

FIG. 4 is a longitudinal sectional view of a JFET transistor according to the invention;

FIG. 5 is a sectional view of the JFET transistor according to the invention taken along the line V—V in FIG. 4; and FIG. 6 is a perspective view of the JFET transistor according to the invention, with the substrate illustrated in section.

DETAILED DESCRIPTION OF A PREFERRED EMBODIMENT

Figure 1:
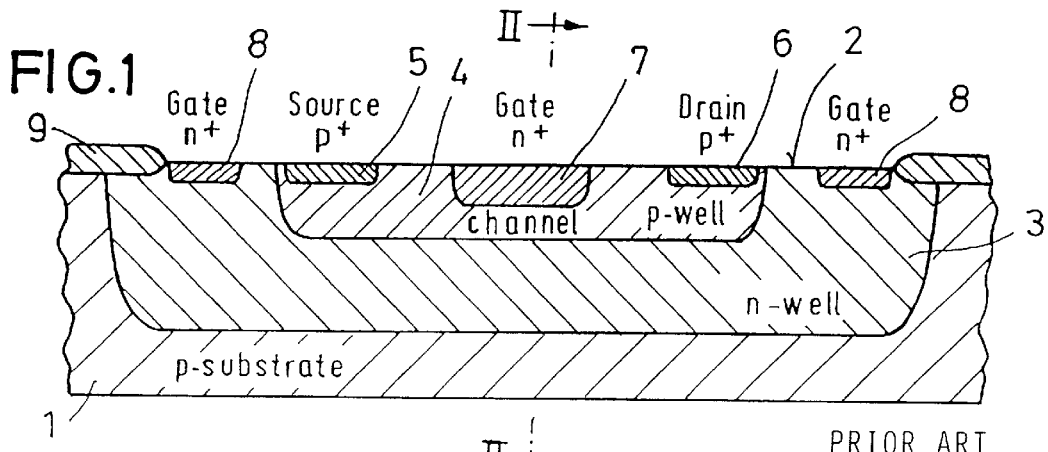
FIG. 1 is a cross-sectional view of a known JFET transistor in CMOS technology.
Figure 2:
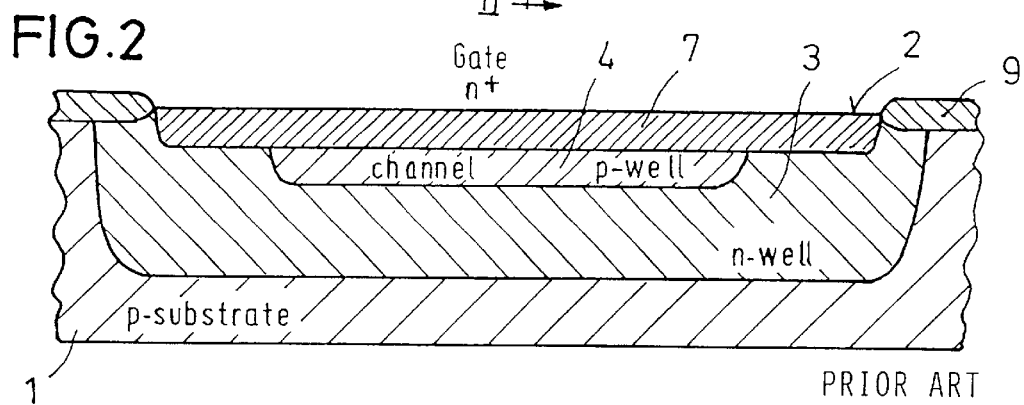
FIG. 2 is a sectional view of the JFET transistor taken along the line II—II in FIG. 1.
Figure 3:
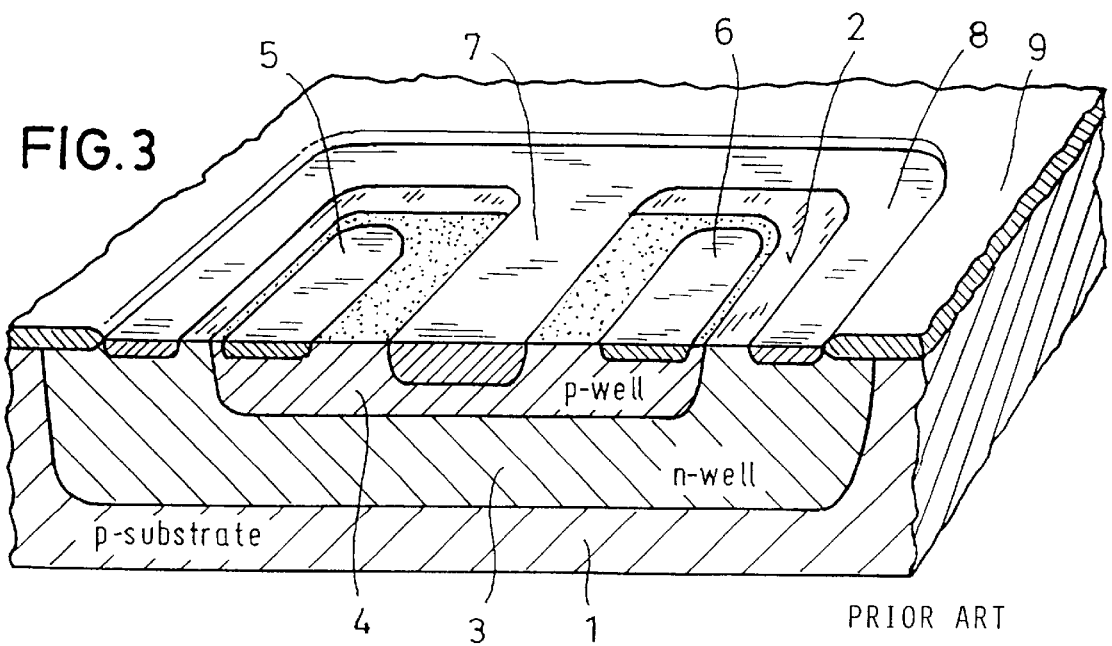
FIG. 3 is a perspective view of the JFET transistor, with the substrate illustrated in section.

FIGS. 4–6 illustrate various sectional and perspective views of a JFET transistor 10 according to the instant invention, which is configured in CMOS technology. An embedment well region 16 (referred to hereunder as an n-well) is thermally diffused into a weakly p-doped substrate 12 from the surface 14 thereof. The surface area of this n-well 16 exposed on the surface 14 of substrate 12 is limited on all sides by field oxide 18. A channel well region 20 (referred to hereunder as a p-well) is introduced by ion implantation into the n-well 16 from the surface 14 of substrate 12. Both wells 16,20 are relatively weakly doped, wherein particularly phosphorus doping material is used for doping the n-well 16 and boron doping material is preferred for doping the p-well 20.

Within the p-well 20, the surface 14 has arranged therein a source electrode region 22, a drain electrode region 24 and therebetween a gate electrode region 26. The gate electrode region 26, like the two other electrode regions 22,24, is shaped in the manner of a web but in contrast to the two other electrode regions 22,24 is arranged to overlap the p-well 20 on both ends of region 26 (cf. FIG. 6). On these ends, the gate electrode region 26, for providing an improved electric connection of the n-well 16, can merge into an annular electrode region 28 which, lying in the n-well 16, extends around the p-well 20. All of the electrode regions 22, 24, 26 and 28 have a degenerated doping, wherein the source and drain electrode regions 22,24 have a p-doping and the gate electrode regions 26,28 have an n-doping. Thus, the actual JFET transistor 10 is formed in the p-well 20, wherein the controllable channel 30 is arranged below the gate electrode region 26.

The novel constructional feature of the JFET transistor 10 resides in the formation of a plurality of partial regions 32 which, in the case of a JFET transistor, have an n-doping and which are arranged below the gate electrode region 26 and extend in a vertical direction through the p-well 20 into the n-well 16. These partial regions 32 are arranged in a mutually spaced relationship along the extension of the web-shaped gate electrode region 26. Due to the mutual distances of the partial regions 32, channel partial regions 34 are generated in the p-well 20 which determine the actually effective channel 30 of JFET transistor 10. The doping of the n-doped partial regions 32 is considerably higher than the doping of the p-well 20, and therefore the space-charge zones extend into the p-well 20 on both sides of each partial region 32 to pinch off the channel 30. This pinch-off effect and thus the pinch-off voltage is thus determined by the distance X between adjacent partial regions 32, while the scaling of the JFET transistor 10 is performed by placing a desired number of partial regions 32 laterally adjacent to each other. In this manner, however, the pinch-off voltage is determined exclusively by design and layout measures, respectively; thus, for varying the pinch-off voltage of the JFET transistor 10, no process parameters, e.g. the doping material concentration and the doping material depth of doped regions introduced into the surface 14 of substrate 12, will be relevant anymore.

The above described concept makes it possible to realize a transistor on the basis of an n-well CMOS process, which will meet the following demands.

1. Insulation from the p-substrate and thus no influence of the substrate on the pinch-off voltage;
2. possibility to use JFET transistors for channel operation with voltages below Vss (substrate potential);
3. the voltage sustaining capability is maximized by the retrograde p-well;
4. favorable noise behavior as compared to MOS transistors;
5. possibility to set variable pinch-off voltages through the design;
6. lowest possible and particular modular extension of the process;

7. no influence of the process extension on the behavior of the other components.

As evident from the above description, the following novel approach was selected for realizing these properties:

Maintenance of the conventional well concept as known from CMOS processes (diffused n-well);

forming the p-well by an (existing) implantation;

the existing (shallow) drain/source implantation as used for CMOS transistors is utilized as a gate electrode;

no change of the thermal balance (compatibility, modular process option);

introduction of a lateral pinch-off of the channel.

After diffusion of the n-well 16, the relatively weakly doped p-well 20, forming the conductive channel 30 of the JFET transistor 10, is generated within the n-well 16 by boron implantation. This well 20 is subject to the following requirements:

lowest possible surface concentration to guarantee the desired voltage sustaining capability towards the gate electrode;

maximum depth determined by the n-well;

sufficient doping material concentration in the depth to guarantee the highest possible current conductivity of the transistor.

These requirements are fulfilled particularly by a two-step implantation carried out after the diffusion of the n-well 16. By this implantation, practically any desired retrograde well profile with the required properties with regard to the voltage sustaining capability can be set in the depth. The contacting of well 20 is performed by the corresponding drain/source implantations. To obtain the required voltage sustaining capability, care must be taken that a sufficient distance is maintained between the p+ and the n+ implantation.

Due to the shallow gate electrode 26, there is obtained a relatively high pinch-off voltage which is also fixedly preset by the process.

A novel configuration for the JFET transistor 10 is obtained by extending the gate electrode 26 by the additional partial regions 32 (referred to hereunder as "n-type plug implantations") which, if suitably dimensioned, pinch off the conductive channel 30 in a lateral direction (cf. FIGS. 5 and 6). These implantations should meet the following demands:

Diffusion depth larger than that of the p-well;

sufficiently high doping material concentration to pinch off the channel (space-charge zone largely in the p-type conductive channel 32);

doping gradient suitable for the required voltage sustaining capability.

By selecting the distance X (FIG. 5), the pinch-off voltage of the JFET transistor 10 can be set in a wide range practically in any desired manner and without depending of the process. The scaling of transistor 10 is performed by placing a desired number of plug implantation channel regions laterally adjacent to each other.

The transistor of the described configuration fulfills all of the above mentioned demands while being completely compatible with the existing CMOS process. The sole extensions of the process reside in the (already existing) modules for the p-type wall and the n-type plug implantations.

What is claimed is:

1. A JFET transistor comprising:

a semiconductor substrate, a channel well region of a first conductive type formed in the substrate, source and drain electrode regions of the first conductive type which are arranged in a mutually spaced relationship in the channel well region, an embedment well region of a second conductive type opposite the first conductive type wherein the embedment well region is diffused into the substrate by thermal induction and is arranged around the channel well region and therebelow, a gate electrode region of the second conductive type extending between the source and drain electrode regions through the channel well region into the embedment well region, wherein below the gate electrode region, a channel region is formed within the channel well region, with the cross section of said channel region being controllable by means of space-charge zones formed in the transition regions between the gate electrode region and the channel well region, wherein below the gate electrode region, a plurality of partial regions of the second conductive type are arranged next to each other in the direction of the extension of the gate electrode region and in a mutually spaced relationship, said partial regions bordering on the gate electrode region and extending through the channel well region into the embedment well region.

2. The JFET transistor according to claim 1, wherein the channel well region is formed by ion implantation of a doping material.

3. The JFET transistor according to claim 2, wherein the channel well region has a higher doping material concentration in the depth than on the surface thereof.

4. The JFET transistor according to claim 3, wherein the channel well region is formed by a multi-step, particularly two-step ion implantation, with the doping material placed into the substrate with different energy levels in the individual implantation steps.

5. The JFET transistor according to claim 1, wherein the first conductive type is p-conductive and the second conductive type is n-conductive.

6. The JFET transistor according to claim 2, wherein the channel well region is formed by a multi-step, particularly two-step ion implantation, with the doping material placed into the substrate with different energy levels in the individual implantation steps.

* * * * *